(12) United States Patent
Koshiba

(10) Patent No.: US 9,389,513 B2
(45) Date of Patent: Jul. 12, 2016

(54) METHOD OF FORMING PATTERN, SYSTEM FOR CALCULATING RESIST COATING DISTRIBUTION AND PROGRAM FOR CALCULATING THE SAME

(75) Inventor: Takeshi Koshiba, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 835 days.

(21) Appl. No.: 12/879,569

(22) Filed: Sep. 10, 2010

(65) Prior Publication Data

US 2011/0189601 A1    Aug. 4, 2011

(30) Foreign Application Priority Data

Jan. 29, 2010    (JP) ................. P2010-019694

(51) Int. Cl.
*G03F 7/20*    (2006.01)
*G06F 17/50*    (2006.01)

(52) U.S. Cl.
CPC . *G03F 7/20* (2013.01); *G06F 17/50* (2013.01)

(58) Field of Classification Search
CPC ......................................................... G03F 7/20
USPC ......................................................... 264/319
See application file for complete search history.

(56) References Cited

U.S. PATENT DOCUMENTS

2009/0267268 A1*    10/2009    Yoneda et al. ................. 264/319

FOREIGN PATENT DOCUMENTS

JP    2007-296783    11/2007
JP    2009-88376    4/2009

OTHER PUBLICATIONS

Koshiba, T. et al., "Pattern Generating Method and Process Determining Method," U.S. Appl. No. 12/822,716, filed Jun. 24, 2010.

* cited by examiner

*Primary Examiner* — Larry Thrower
(74) *Attorney, Agent, or Firm* — Finnegan, Henderson, Farabow, Garrett & Dunner LLP

(57) ABSTRACT

In one embodiment, a method of forming a resist pattern on a substrate is provided. Information of a template pattern formed on a template based on template pattern data is obtained. A resist coating distribution is set based on the information of the template pattern. A resist is formed on a substrate based on the resist coating distribution. The template is brought into contact with the resist formed on the substrate so that the resist is filled into the template pattern formed on the template. The filled resist is cured. The template is separated from the cured resist so that a resist pattern is formed on the substrate.

23 Claims, 12 Drawing Sheets

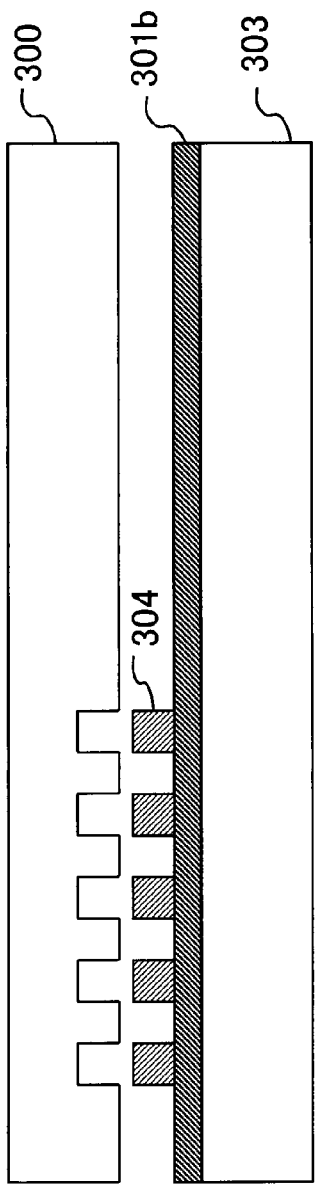
FIG. 3D
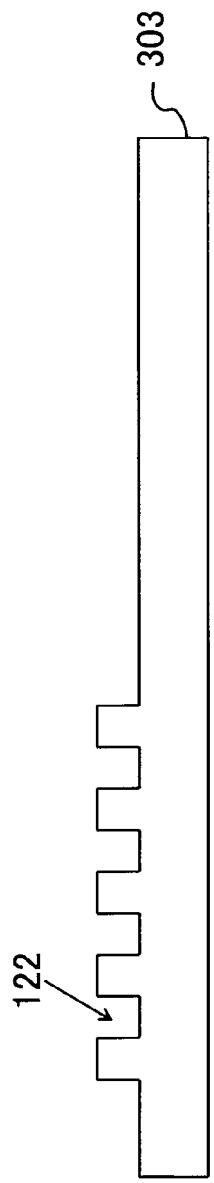
FIG. 3E
FIG. 3F

METHOD OF FORMING PATTERN, SYSTEM FOR CALCULATING RESIST COATING DISTRIBUTION AND PROGRAM FOR CALCULATING THE SAME

CROSS REFERENCE TO RELATED APPLICATION

This application is based upon and claims the benefit of priority from the prior Japanese Patent Application No. 2010-19694, filed on Jan. 29, 2010, the entire contents of which are incorporated herein by reference.

FIELD

Embodiments described herein relate to a method of forming a pattern for use in a fabrication process such as a process of fabricating semiconductor devices, hard disks or photo arrays. Further, the embodiments relate to a system and program for calculating resist coating distribution.

BACKGROUND

Recent years, an imprint method for transferring a pattern of an original plate to a substrate to be transferred has been focused. In the imprint method, an original plate, i.e., a template, on which a pattern to be transferred is formed, is pressed against a curable organic material layer, for example, a resist formed on a substrate, then the resist is filled in the pattern of the template, and further the filled resist is cured by irradiating light, for example, so that the pattern is transferred.

Japanese Patent Application Publication No. 2009-88376A discloses calculating a resist distribution on coating the resist on a substrate. The calculation is performed using information of a designed pattern to be formed on a template in consideration of filling characteristics, etc.

However, a pattern actually formed on a template often differs from a designed pattern in dimension, density, position, depth and so on. When a template is fabricated based on information of a designed pattern, for example, the dimension of a pattern formed by various fabrication processes varies so that a pattern formed on the template often deviates from the designed pattern.

Thus, the resist coating distribution calculated from the designed pattern of the template is not always appropriate for the template actually fabricated. Filling failure (defects) of the resist likely occurs, when the resist is filled into the template pattern, for example. Moreover, it takes time to complete filling the resist in the template pattern so that the throughput likely lowers.

BRIEF DESCRIPTION OF THE DRAWINGS

FIGS. 3A to 3F are sectional views to explain a method of fabricating a template as the method of forming the pattern according to the embodiment.

DETAILED DESCRIPTION

Figure 1:
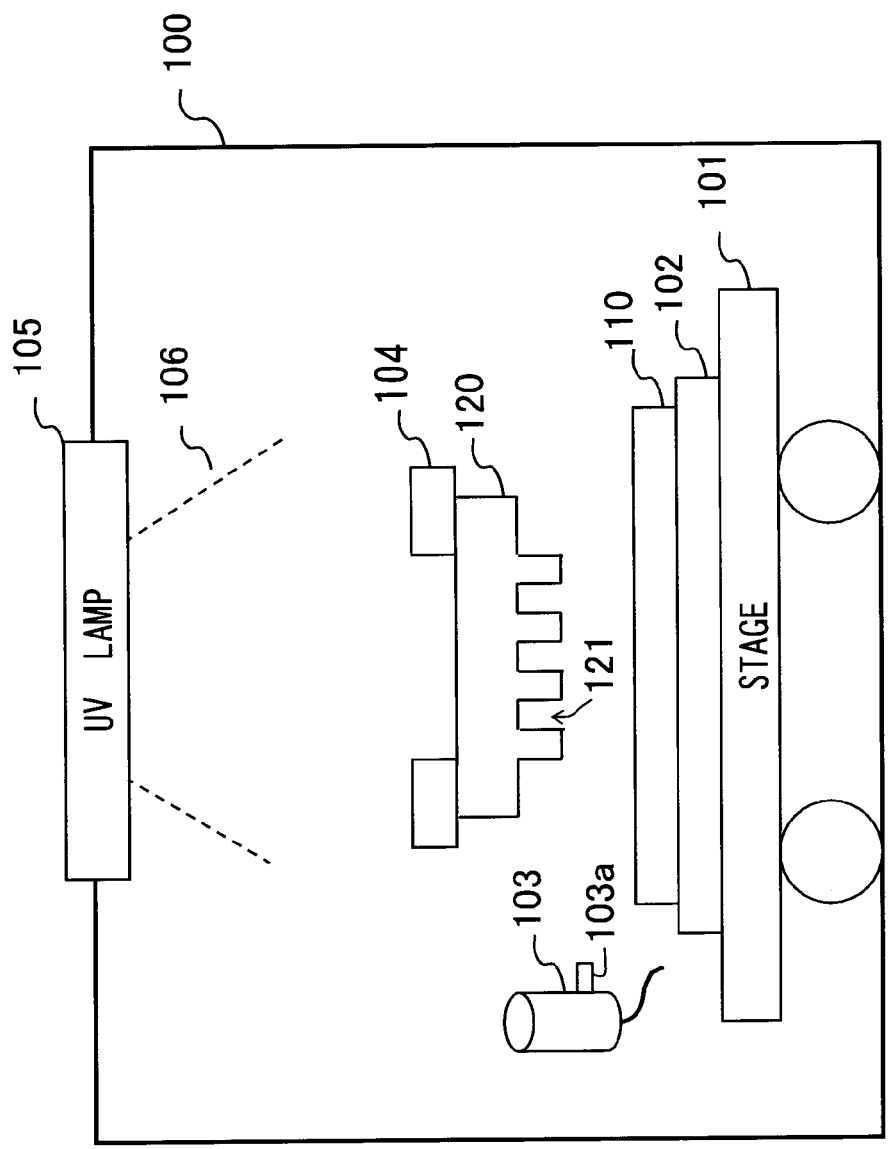
FIG. 1 is a schematic view showing an imprint apparatus which is used in a method of forming a pattern according to an embodiment.

According to an embodiment, a method of forming a pattern is provided. In the method, information of a template pattern formed on a template based on template pattern data is obtained. A resist coating distribution is set based on the information of the template pattern. A resist is formed on a substrate based on the resist coating distribution. The template is brought into contact with the resist formed on the substrate so that the resist is filled into the template pattern formed on the template. The filled resist is cured. The template is separated from the cured resist so that a resist pattern is formed on the substrate.

According to another embodiment, a system for calculating a resist coating distribution is provided. In the system, a coating distribution of a resist is calculated based on information of a template pattern formed on a template. The template is to be used in an imprint method and the template pattern is formed based on template pattern data. The imprint method forms a resist pattern on a substrate by contacting the template with the template pattern onto a resist coated on the substrate.

According to further another embodiment, a program for calculating a resist coating distribution which is executed by a computer program is provided. In the program, a coating distribution of a resist is calculated based on information of a template pattern formed on a template. The template is to be used in an imprint method and the template pattern is formed based on template pattern data. The imprint method forms a resist pattern on a substrate by contacting the template with the template pattern onto a resist coated on the substrate.

Hereinafter, embodiments will be described with reference to the drawings. In the drawings, the same reference characters denote the same or similar portions, respectively.

An imprint apparatus, which is used in a method of forming a pattern according to an embodiment, will be described with reference to FIG. 1. FIG. 1 is a schematic view showing an example of the imprint apparatus.

As shown in FIG. 1, an imprint apparatus 100 is provided with a stage 101, a substrate chuck 102 to chuck a substrate to be processed, a resist coating unit 103, a template control mechanism 104 and a UV lamp 105.

The substrate chuck 102 fixes a substrate 110 such as a wafer to be processed. The substrate chuck 102 is placed on the stage 101, and the stage 101 is moved two-dimensionally. The resist coating unit 103 coats a resist material onto the substrate 110 in accordance with a preset distribution.

The template control mechanism 104 holds a template 120 on which concave patterns 121 are formed, brings the template 120 into contact with the resist coated on the substrate, and separate the template 120 from the resist.

The UV lamp 105 irradiates a UV light 106 onto the resist through the template 120 in order to cure the resist. The template 120 is a substrate of a material such as quartz or fluorite, through which a UV light transmits and on which concaves and convexes are formed by plasma etching.

The resist coating unit 103 is provided with a system 90 for calculating resist coating distribution and a resist coating nozzle 103a which coats a resist onto a substrate in accordance with a resist coating distribution.

Figure 8:
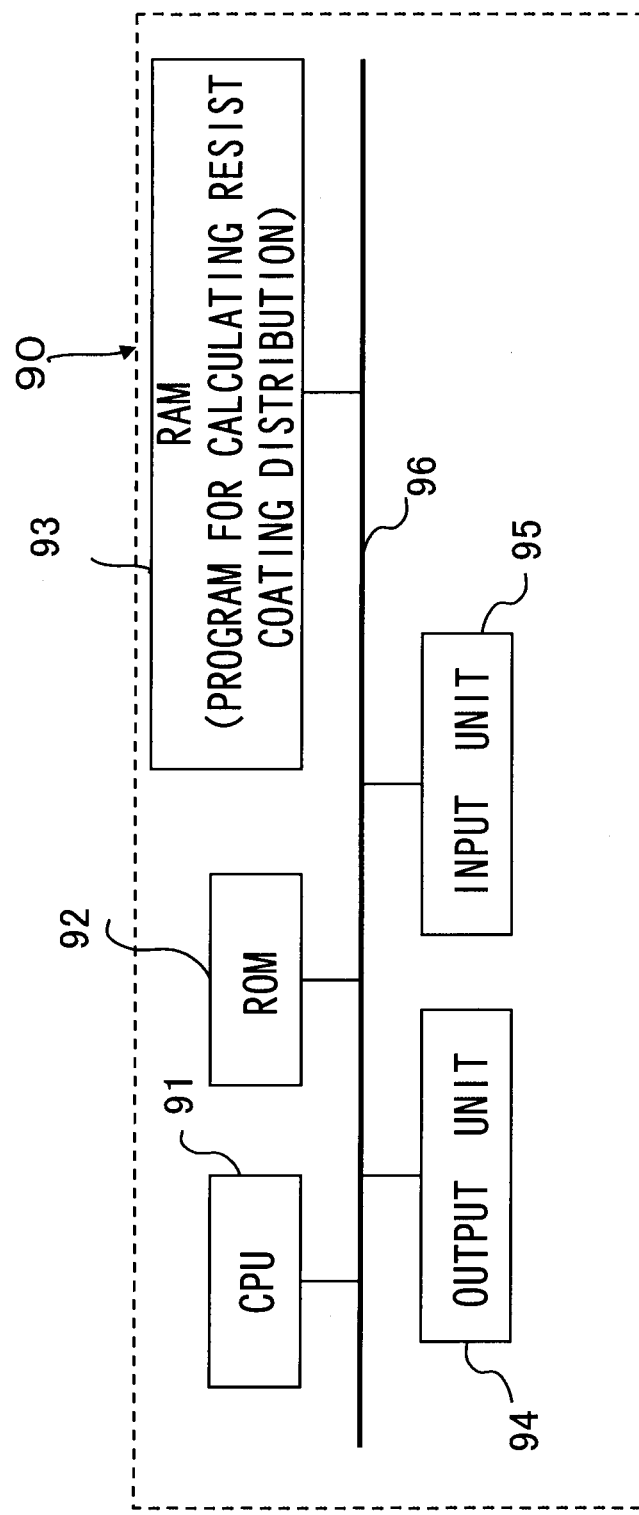
FIG. 8 is a schematic view of a system for calculating resist coating distribution according to the embodiment.

FIG. 8 shows a hardware configuration of the system 90 for calculating resist coating distribution schematically. The system 90 is provided with a CPU (Central Processing Unit) 91, a ROM (Read Only Memory) 92, a RAM (Random Access Memory) 93, an output unit 94, an input unit 95. The CPU 91, the ROM 92, the RAM 93, the output unit 94, and the input unit 95 are connected through the bus 96, and constitute a computer.

The CPU 91 calculates a coating distribution of a resist, which is formed on the substrate 110, using a program for calculating resist coating distribution, as a computer program, which will be described below. The resist coating distribution is coating distribution information as to position, density and amount, respectively of the resist to be coated on the substrate 110 and in a surface of the substrate 110.

As the resist is coated in a form of droplets, for example, the resist coating distribution includes information any one of positions, densities (intervals) and amounts, respectively of the resist droplets. The positions, densities (intervals) and amounts, respectively of the resist droplets, can be adjusted in accordance with the accuracy of the resist coating nozzle 103a.

In the calculation of the resist coating distribution, template pattern information, i.e., actual template pattern information is utilized. The template pattern information is information including at least one of density, position, dimension, sidewall angle information, i.e., tilt angle of a sidewall, and depth, respectively of a concave pattern and per a unit area of the concave pattern actually formed on a template to be used in forming a pattern by an imprint method. Such template pattern information can be obtained using an optical measuring device or the like, after forming the concave pattern on the template. The concave pattern provided on the template is formed based on template pattern data which is obtained using a design pattern of a circuit pattern to be formed on a substrate.

The input unit 95 has a mouse and a keyboard. The input unit 95 receives information such as template pattern data, a preset resist-thickness value of a remaining film of a resist to be formed on a substrate, a distribution of resist volatilization volume or a concavo-convex shape of a surface of the substrate. The remaining film of the resist corresponds to a remaining film 705 of a resist shown in FIG. 7D which will be described below. Further, the input unit 95 may receive template pattern information.

The information inputted to the input unit 95 is transmitted to the CPU 91. The information including the template pattern data, the preset film-thickness value of the remaining resist, the distribution of resist volatilization volume, the concavo-convex shape of the surface of the substrate and the template pattern information is stored in the ROM 92 or the RAM 93 in the system for calculating resist coating distribution.

The program for calculating resist coating distribution is stored in the ROM 92, and is loaded in the RAM 93 through the bus 96. FIG. 8 shows the state that the program for calculating resist coating distribution is loaded in the RAM 93.

The CPU 91 executes the program for calculating resist coating distribution loaded in the RAM 93. Specifically, in the system 90 for calculating resist coating distribution, the CPU 91 reads the program from the ROM 92 and stores the program in a program storage area of the RAM 93, and then executes various kinds of processing. The CPU 91 stores various data produced on performing various kinds of processing, temporarily, in a data storage area of the RAM 93.

The output unit 94 outputs the resist coating distribution calculated by the program for calculating resist coating distribution.

The system 90 for calculating resist coating distribution according to the embodiment does not always need to be included in the resist coating unit 103 shown in FIG. 1. The system 90 may be provided apart from the resist coating unit 103 in the imprint apparatus 100 or may be provided outside the imprint apparatus 100. A resist coating distribution outputted from such a system can be inputted to the resist coating unit 103, and a resist discharged from the resist coating nozzle 103a can be coated onto the substrate 110 in accordance with the resist coating distribution.

Figure 2A:
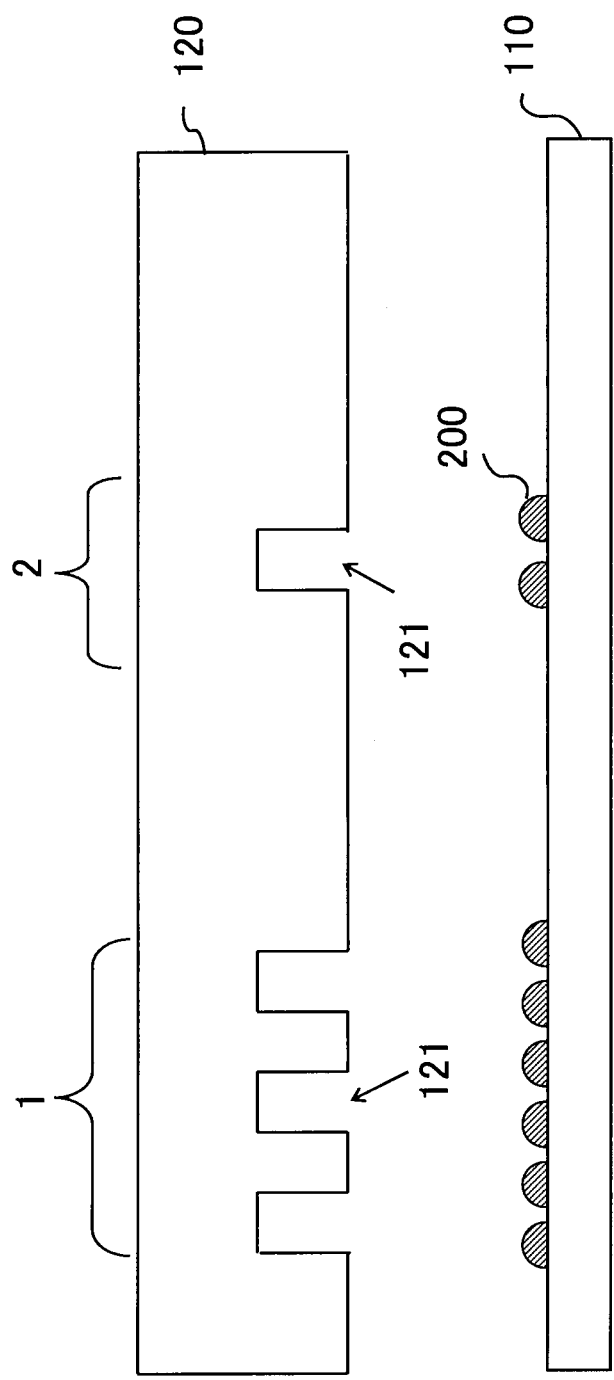
FIGS. 2A-2C are views to explain examples of coating a resist onto a substrate.
Figure 2B:
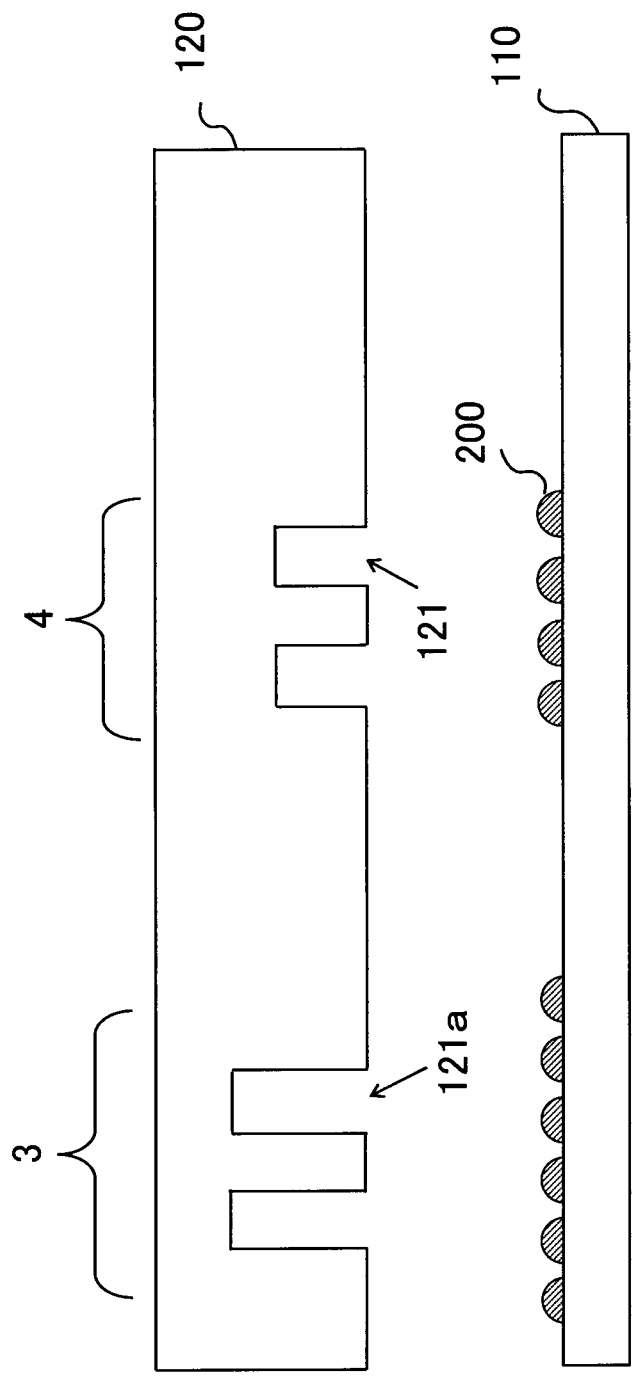
Figure 2C:
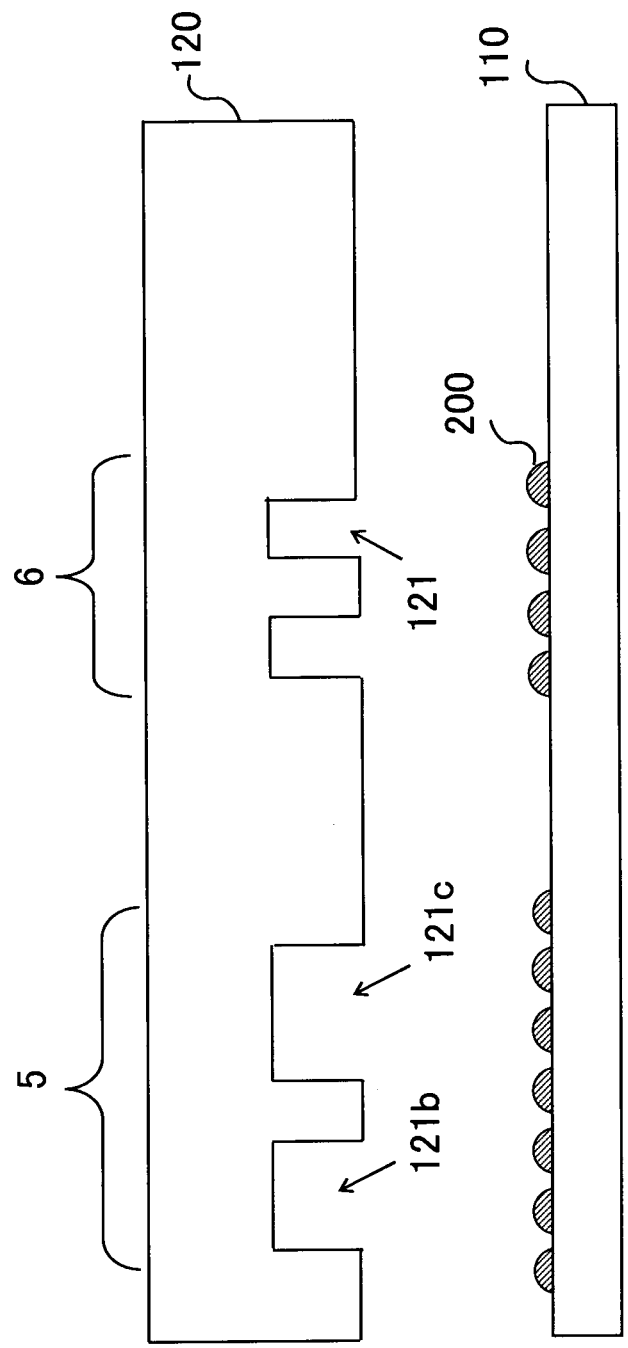

Examples of coating a resist onto a substrate will be explained with reference to FIGS. 2A to 2C. FIGS. 2A to 2C are views to explain the examples.

As shown in FIG. 2A, a template 120 is prepared. The template 120 has areas 1, 2. The area 1 has concave patterns 121 whose density is large. The area 2 has concave patterns 121 whose density is small.

The template 120 is brought in contact with resist droplets 200 coated on a substrate 110, and a resist pattern is formed. The resist coating distribution is set so that the amount of resist droplets to be coated on a substrate region facing the area 1 is larger than that of the resist droplets to be coated on another substrate region facing the area 2, on forming the resist droplets 200.

Similarly, when the density of the concave patterns formed on the template 120 based on designed patterns is larger than a desirable density of the concave patterns, the amount of the resist droplets is increased more than that set previously based on the designed patterns.

In order to increase the amount of the resist, the density of the resist droplets may be increased, i.e., the interval between the resist droplets may be increased, or the dimension of the resist droplets may be increased.

Further, as shown in FIG. 2B, a template 120 is prepared. The template 120 has areas 3, 4. The area 3 has concave patterns 121a whose depth, i.e., distance from opening surfaces to bottom surfaces of the patterns 121a, is large. The area 4 has concave patterns 121 whose depth is small. The template 120 is brought in contact with resist droplets 200 coated on a substrate 110 so that a resist pattern is formed. On forming the resist pattern, the resist coating distribution is set so that the amount of the resist droplets coated on a substrate region facing the area 3 is larger than that of the resist droplets coated on another substrate region facing the area 4.

Similarly, when the depth of the concave patterns formed on the template 120 based on designed patterns are larger than a desirable depth of the concave patterns, the amount of the resist droplets is increased more than that set previously based on the designed patterns.

In order to increase the amount of the resist, the density of the resist droplets may be increased, i.e., the interval between the resist droplets may be increased, or the size of the resist droplets may be increased.

Furthermore, as shown in FIG. 2C, a template 120 is prepared. The template 120 has areas 5, 6. The area 5 has concave patterns 121b, 121c whose dimensions are large. The area 6 has concave patterns 121 whose dimensions are small.

The template 120 is brought in contact with resist droplets 200 coated on a substrate 110 so that a resist pattern is formed. On forming the resist pattern, the resist coating distribution is set so that the amount of the resist droplets coated on a substrate region facing the area 5 is larger than that of the resist droplets coated on another substrate region facing the area 6.

Similarly, when the dimensions of the concave patterns formed on the template 120 based on designed patterns are larger than desirable dimensions of the concave patterns, the amount of the resist droplets is increased more than that set previously based on the designed patterns.

In order to increase the amount of the resist, the density of the resist droplets may be increased, i.e., the interval between the resist droplets may be increased, or the size of the resist droplets may be increased.

As described above, resist droplets 200 can be supplied into concave patterns sufficiently by setting the distribution of the resist droplets suitably, even if the density, depth, or dimension of the concave patterns is increased relative to that of designed patterns. Thus, it is possible to suppress such an unfilled defect that resist is not sufficiently filled in concave patterns, and further to decrease the time period until filling of resist in the concave patterns is completed so that the throughput is enhanced.

A method of forming patterns on a template according to the embodiment will be described with reference to FIGS. 3A to 3F.

A template pattern data to be formed on a template substrate is prepared. The template pattern data corresponds to design pattern data of a circuit pattern formed on a wafer substrate. For example, the template pattern data is same as the design pattern data, or an inverted pattern data of the design pattern data in some cases. The template pattern data includes at least one of data of position, dimension, sidewall tilt angle and depth of a pattern to be formed on a template.

Figure 3A:
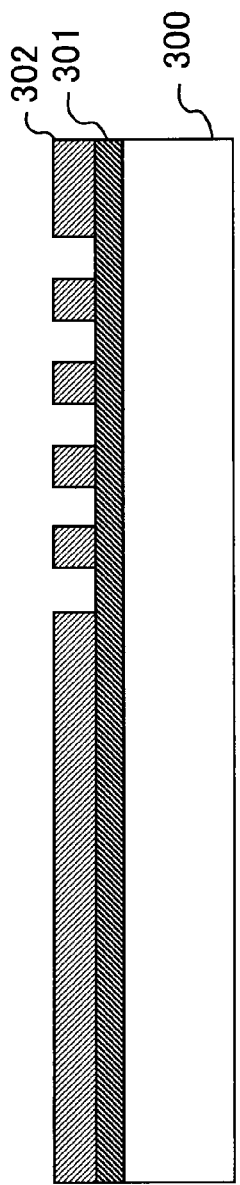

As shown in FIG. 3A, a template substrate 300 is prepared. The template substrate 300 is made of quartz. A hard mask 301 as a film to be processed and an EB resist 302 for use in an EB pattern drawing are formed and stacked on the template substrate 300 in this order. The template substrate 300 is a substrate of a master template which is a master of a copy template to be used in mass production where patterns are formed on a wafer by an imprint method. The patterns may be formed on a wafer by an imprint method, using the master template directly.

A pattern is drawn on the EB resist 302 based on the template pattern data, using an Electron Beam (EB) drawing apparatus. After the drawing, the EB resist 302 is selectively etched so that a resist pattern is formed. Since the results of forming the resist pattern may vary depending on the condition of the EB process, the pattern indicated by the prepared template pattern data and the pattern of the EB resist 302 formed by the EB process are different in density, dimension and position depending on cases. The variations of the density, dimension and position between the patterns are deemed as a pattern variation by the EB process.

Figure 3B:
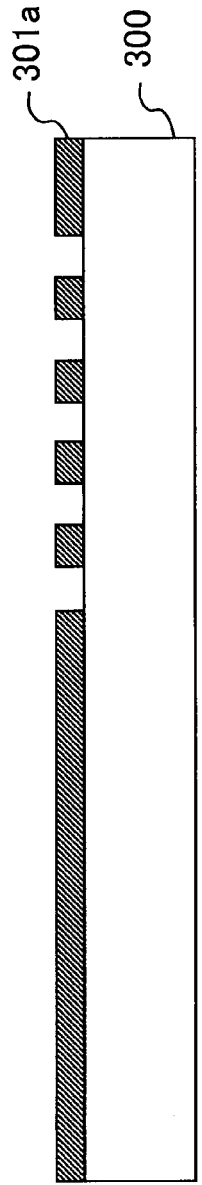

Then, as shown in FIG. 3B, using the pattern of the EB resist 302 as a mask, the hard mask 301 formed under the EB resist 302 is processed to be etched so that a hard mask (HM) pattern 301a is formed. After forming the hard mask pattern, the pattern of the EB resist 302 is removed. Since the results of etching the hard mask may vary depending on the condition of the etching process of the hard mask, the pattern of the EB resist 302 and the HM pattern 301a formed by the HM etching process are different in density, dimension, and position depending on cases. The variations of the density, dimension and position between the patterns are deemed as a pattern variation by the HM etching process.

Figure 3C:
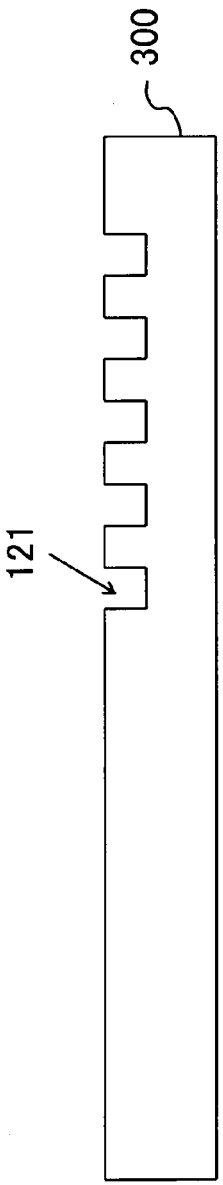

Further, as shown in FIG. 3C, by using the hard mask pattern 301a as a mask, a master template substrate 300 provided under the hard mask pattern is processed to be etched so that a master template pattern containing concave patterns 121 is formed. After forming the master template pattern, the hard mask pattern 301 is removed. Since the results of etching the template substrate 300 may vary depending on the condition of the etching process of the template substrate 300, the HM pattern 301a and the master template pattern formed by the etching process are different in density, dimension and position depending on case. The variations of the density, dimension and position between the patterns are deemed as a pattern variation by the etching process of the master template.

When a pattern is formed on a wafer using the master template, the variations of the sidewall tilt angle and depth between the pattern formed on the master template and the pattern of the prepared template pattern data may be added to the pattern variation by the etching process of the master template.

Then, as shown in FIG. 3D, a copy template substrate 303 to be utilized on forming a pattern on a wafer is prepared. The copy template substrate 303 is made of quartz. On the copy template substrate 303, a hard mask 301b to be processed and a resist 304 of a curable organic material layer for imprinting are formed to be stacked in this order.

On coating the resist 304 for imprinting, a resist coating distribution is calculated and then the resist 304 is coated onto the hard mask 301b on the copy template substrate 303 based on the calculated resist coating distribution. The resist coating distribution is calculated based on density, dimension, position, sidewall tilt angle and depth which are information of the pattern formed on the master template. The method of calculating the resist coating distribution will be described below with reference to FIG. 4.

Further, using of an imprint process, the pattern of the master template 300 is transferred to the resist 304 for imprinting to form a resist pattern. The imprint process is a general imprint process. Specifically, in the imprint process, the patterned surface of the master template substrate 300 is brought into contact with the resist 304 coated on the hard mask 301b on the copy template substrate 303 so that the resist 304 is filled in the pattern of the master template 300. The filled resist 304 is irradiated with light, for example, is cured, and then the master template 300 is separated from the resist 304. Subsequently, the thin remaining resist left on the entire surface of the hard mask 301b is etched so that the pattern of the resist 304 is formed.

Since, the results of forming the pattern may vary depending on the condition of the imprint process, the master template pattern and the pattern of the resist 304 formed by the imprint process are different in density, dimension, position depending on cases. The variations of the density, dimension and position between the patterns are deemed as a pattern variation by the imprint process performed on forming the copy template.

Further, as shown in FIG. 3E, using the pattern of the resist 304 formed by the imprint method as a mask, the hard mask (HM) 301b provided under the resist 304 is processed to be etched to fabricate a hard mask pattern (HM pattern) 301c is formed. After forming the hard mask pattern 301c, the resist 304 is removed. Since the results of forming the hard mask pattern may vary depending on the condition of the HM etching process, the pattern of the resist 304 and the hard mask pattern 301c formed by the HM etching process are different in density, dimension and position depending on cases. The variations of the density, dimension and position between the patterns are deemed as a pattern variation by the HM etching process.

Then, as shown in FIG. 3F, using the hard mask pattern 301c as a mask, the template substrate 303 provided under the hard mask 301c is processed to be etched so that a copy template pattern containing a concave pattern 122 is formed. After forming the copy template pattern, the hard mask pattern 301c is removed. Since the results of forming the copy template pattern may vary depending on the condition of the etching process of the copy template substrate, the hard mask pattern 301c and the copy template pattern formed by the etching process are different in density, dimension and position depending on cases. The variations of the density, dimension and position between the patterns are deemed as a pattern variation by the etching process of the copy template.

When a pattern is formed on a wafer using the copy template, the variations of the sidewall tilt angle and depth between the pattern formed on the copy template and the pattern of the prepared template pattern data may be added to the pattern variation by the etching process of the copy template.

The copy template is formed through the above template production process. In the template production process, an actual pattern finally formed on the template and the template pattern data initially prepared are different in density, dimension, position, sidewall tilt angle and depth depending on cases.

Figure 4:
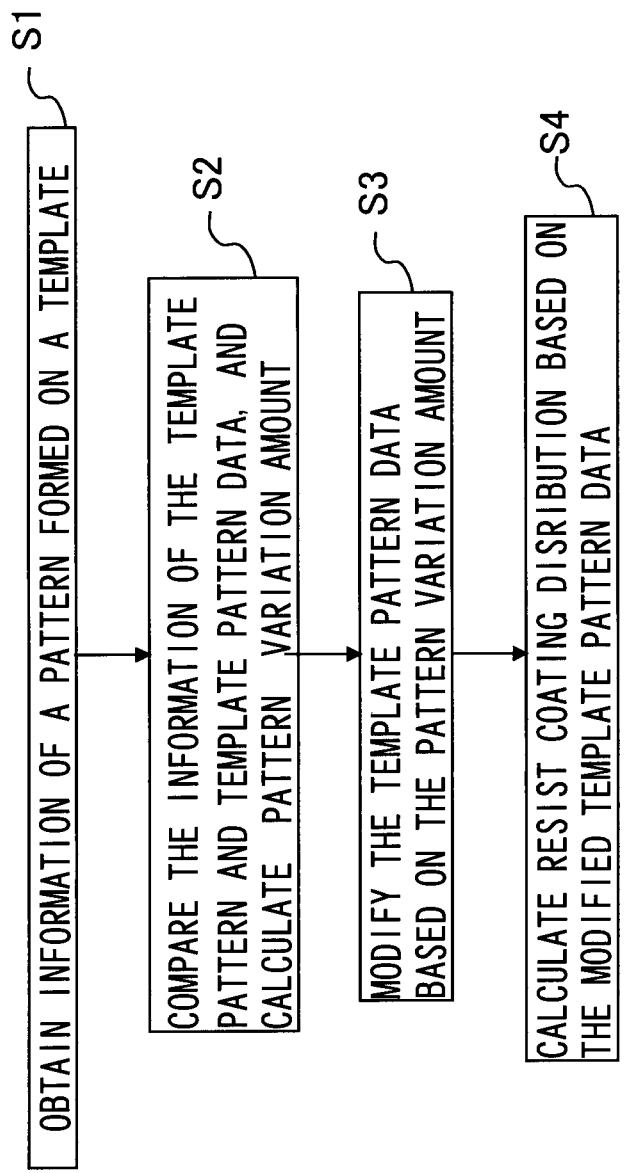
FIG. 4 is a flowchart to explain a method of calculating resist coating distribution according to the embodiment.

In the method of calculating the resist coating distribution according to the embodiment, the resist coating distribution is calculated in consideration of the pattern variations to be caused by the above-described template production process. The method of calculating the resist coating distribution will be described with reference to FIG. 4. FIG. 4 is a flowchart to explain the method of calculating the resist coating distribution.

As shown in step 1, information of a pattern formed on a template, i.e., template pattern information, is obtained. The template is either the master template shown in FIG. 3A or the copy template shown in FIG. 3F.

The template pattern information to be obtained is information including at least any one of density per unit area, dimension, position, sidewall tilt angle and depth respectively of a concave pattern actually formed on a template for use in forming a pattern on a wafer substrate by an imprint method. The template pattern information is obtained by measuring a pattern formed on a template, using a measurement device such as a critical dimension scanning electron microscope (CD-SEM), a wide scan type SEM, an SCD (Scattrometry) device, a critical dimension atomic force microscope (CD-AFM), and a defect inspection device.

Then, as shown in step 2, the template pattern information obtained in step 1 and template pattern data are compared with each other. The template pattern data corresponds to a designed pattern of a circuit pattern to be formed on a wafer and is desirable pattern data to be formed on a template.

The variation amount of an actual pattern formed on the template is obtained by the comparison. The pattern variation amount includes variation amount of any one of density, dimension, position, sidewall tilt angle and depth, respectively of the pattern, and the pattern variation to be caused by each fabrication process of a template is considered, as explained with reference to FIGS. 3A to 3F.

Specifically, when template pattern data and pattern information of a master template are compared with each other, a pattern variation amount is obtained, reflecting, in an integrative way, the pattern variation by an EB process described with reference to FIG. 3A, the pattern variation by the hard mask (HM) etching process described with reference to FIG. 3B, and the pattern variation by the etching process of the master template described with reference to FIG. 3C. The pattern variation amount reflecting those variations is obtained.

Further, when the template pattern data and the pattern information of the copy template are compared with each other, a pattern variation amount is obtained, reflecting, in an integrative way, the pattern variation by an imprint process described with reference to FIG. 3D, the pattern variation by a hard mask (HM) etching process described with reference to FIG. 3E, and the pattern variation by an etching process of the copy template described with reference to FIG. 3F.

The pattern variation amount is any one of the variation amounts of density, dimension, position, sidewall tilt angle and depth, respectively of a pattern, or a combination of these. As an example, a variation amount of pattern dimension will be considered. The variation amount of pattern dimension is 1 nm, when an object pattern of template data is 10 nm and when an object pattern existing on a template actually fabricated is 11 nm.

When the template pattern data is data of a complex two-dimensionally-shaped pattern, the template pattern information may be obtained by extracting a contour of an image acquired by measuring a pattern actually formed on a template by a SEM and the pattern variation amount may be obtained by comparing the obtained template pattern information with the template pattern data by matching.

Figure 5A:
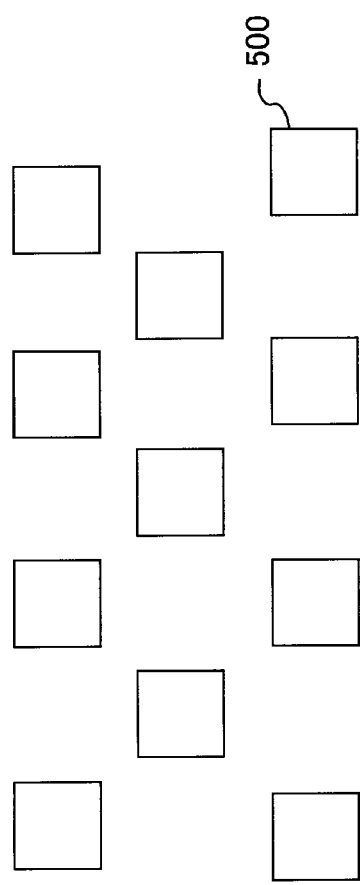
FIGS. 5A, 5B are views showing measurement results of a template pattern data and a pattern formed on the template.
Figure 5B:
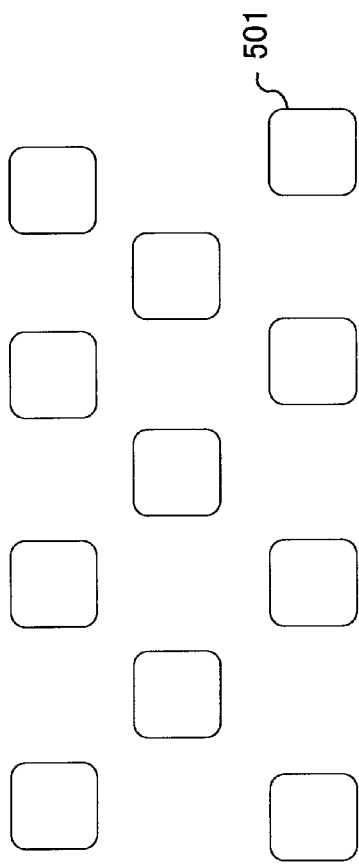

An example of obtaining the pattern variation amount will be described with reference to FIGS. 5A, 5B. FIGS. 5A, 5B show template pattern data and results of measuring a pattern formed on a template, respectively. FIG. 5A shows template pattern data of rectangular contact holes 500. FIG. 5B shows contour images obtained by measuring contact hole patterns 501 formed on a template actually based on the template pattern data by a SEM.

The contour images indicate rounding of corners of contact hole patterns 501 clearly, and the pattern variation amount of the contact hole patterns 501 is estimated exactly.

When a value of depth is obtained as the template pattern information, a profile of a concave pattern of the template can be obtained utilizing an AFM or the like.

Then, as shown in step S3, the template pattern data is modified based on the pattern variation amount calculated in step S2. An example of modifying the template pattern data will be specifically described below.

A method of modifying the template pattern data will be explained. The method rules the correspondence relation between a feature amount of the template pattern data and the pattern variation amount, and modifies the template pattern data based on the ruling. As the feature amount, any one of pattern density, pattern dimension, distance from an adjacent pattern, pattern pitch, pattern position, and pattern depth, respectively of the template pattern data, may be used.

A case where distance from an adjacent pattern is employed as the feature amount of the template pattern data will be described. In this case, a distance between a predetermined object pattern of the template pattern data and the adjacent pattern is obtained. On the other hand, the object pattern is compared with pattern information of a pattern actually formed on a template so that a pattern variation amount is obtained. Here, the correspondence relation between the obtained distance from the adjacent pattern and the obtained pattern variation amount is established.

Then, with regard to a plurality of other patterns different in distance from the respective adjacent patterns, the relations between the distances from the adjacent patterns and pattern variation amounts are sequentially obtained, respectively, and the obtained relations are plotted. The relations between the distances from the adjacent patterns and the pattern variation amounts are ruled based on the plotted correspondence relations.

Specifically, the relations between the distances from the adjacent patterns and the pattern variation amounts are prepared as a table. Alternatively, those relations are made into a function or are modeled, by an approximation function. When a feature amount other than distance from an adjacent pattern is used, a rule showing a correspondence relation with a pattern variation amount is prepared in a similar manner.

When the template pattern data of an object pattern is modified in consideration of a pattern variation amount, the modification amount is obtained with reference to the prepared rule, and the modification is performed in accordance with the modification amount. For example, when the distance between the object pattern to be modified and the adjacent pattern is 10 nm, the template pattern data of the object pattern can be modified to become 9 nm if the rule is that the pattern variation amount is a dimension variation of 1 nm. When the feature amount is other than distance from an adjacent pattern, the template pattern data is modified in accordance with the rule prepared in a similar manner. As described above, the overall template pattern data is modified quickly with reference to a modification rule/model.

Once a modification rule is prepared, it is enough only to be referred to the prepared rule on each subsequent occasion of modifying template pattern data, and another modification rule is not necessary to be prepared again.

Subsequently, in FIG. 4, a resist coating distribution is calculated based on the modified template pattern data (step S4).

The resist coating distribution is calculated from a two-dimensional pattern arrangement and a depth profile of a three-dimensional pattern, respectively of the modified template pattern data. Specifically, the volume of a concave portion of a template pattern is calculated, by making a profile of a three-dimensional digging depth of the modified template pattern data in a depth direction to correspond to a two-dimensional shape of a pattern surface of the modified template pattern data. The distribution of resist, which is required for being filled in concave portions over the entire surface of the template, is calculated by calculating volumes of the concave portions in a similar manner.

The resist coating distribution is required to be determined, reflecting position, shape, and so on of a pattern on a template actually formed. If the resist coating distribution is determined without such reflection, the influence of the position, shape, and so on of the pattern on the template is reflected on a wafer when the template pattern is transferred onto the wafer using an imprint method, so that common defects may occur on the wafer.

The resist coating distribution in the embodiment is determined in consideration of position, dimension, shape, density, and depth, respectively of a pattern actually formed on a template. Thus, it is possible to suppress filling failure of a resist into a concave pattern of a template and to reduce defects on a wafer.

The pattern information of the master template obtained in FIG. 3C is acquired, and the template pattern data is modified based on the acquired pattern information. By the modification, the resist coating distribution is calculated when the imprint method is performed using the copy template shown in FIG. 3F. When a plurality of copy templates is used in mass production, pattern information of all the copy templates is not always required to be obtained. Since it is only necessary to calculate a common resist coating distribution based on pattern information of a master template, the resist coating distribution can be easily obtained.

Further, in the calculation of the resist coating distribution, the film-thickness of a resist, which remains when a resist pattern is formed on a wafer substrate by the imprint method, is considered. This is because, if the remaining resist is too thick, the film-thickness of the resist pattern is excessively reduced by etching back on removal of the remaining resist, and thus etching resistance of the resist pattern may not be satisfactorily ensured when a lower layer film is processed to be etched using the resist pattern as a mask.

A desired range of the film-thickness of the remaining resist, which enables ensuring etching resistance satisfactorily, may be obtained by implementing an experiment or simulation of an imprint method in advance. The resist coating distribution can be calculated so that the remaining resist falls within the desired range when the imprint method is performed.

In a case that a resist is applied onto a wafer substrate based on a resist coating distribution after the resist coating distribution is determined, reflecting position, shape, and so on of a pattern on a template, the verification of whether or not a desired remaining resist may be performed after imprinting. As a result of the verification, when the remaining resist is short, the resist coating distribution is uniformly increased in the substrate surface.

A gap between a wafer substrate with a resist coated and a template may be filled with gas such as $CO_2$ or $N_2$ depending on cases, in order to prevent occurrence of defects due to residual bubbles when a pattern is formed on a wafer by an imprint method. The gas is continuously supplied onto a substrate from around the template during the imprinting operation.

When a highly volatile resist is used, the resist material is volatilized from a surface of a substrate gradually. A distribution of volatilization volume of the resist material occurs within the substrate surface. The volatilization distribution of the resist material may be measured in advance, and the resist coating distribution may be further modified using the measured volatilization distribution.

The volatilization volume distribution of the resist material is obtained by measuring a variation of the resist thickness within the substrate surface in a state that the above gas is sprayed to the resist applied on a substrate experimentally. The obtained volatilization volume distribution is added as a modification value to the resist coating distribution so that the resist coating distribution for use in forming a desired pattern accurately by an imprint method is calculated. In other words, defects due to filling failure can be prevented, and the film-thickness uniformity of a remaining resist in a shot of a template can be enhanced.

Further, the resist coating distribution can be modified in consideration of a surface shape (concaves and convexes) of a wafer substrate where a pattern is to be formed by an imprint method. Generally, concaves and convexes occur in the surface shape of a wafer substrate due to the influence of various fabrication processes depending on cases.

For example, it is known that dishing occurs on a substrate surface on performing CMP of the substrate so that concaves and convexes are produced on the substrate surface.

The concaves and convexes, which are produced locally on the substrate surface of the wafer substrate by such a process, affect the accuracy of a pattern formed using an imprint method. Particularly, when dishing due to CMP occurs on a substrate, it often causes a serious problem. The dishing by the CMP is caused by, for example, a phenomenon that an isolated pattern portion of a relatively large size such as a peripheral pattern portion or a mark portion of a circuit pattern of a semiconductor device is excessively polished due to the elasticity of a polishing pad, in contrast with a fine and dense pattern portion such as a cell portion of the circuit pattern.

A filling failure is likely occur when a resist formed on a wafer substrate is filled into a template pattern, in the case where concaves and convexes are produced on the wafer substrate due to dishing in CMP.

Thus, it is desirable to modify the resist coating distribution corresponding to the concaves and convexes of the wafer substrate, and to reduce defects due to filling failure.

A method of coating a resist corresponding to a surface shape of a substrate will be described with reference to FIGS. 6A to 6D.

Figure 6A:
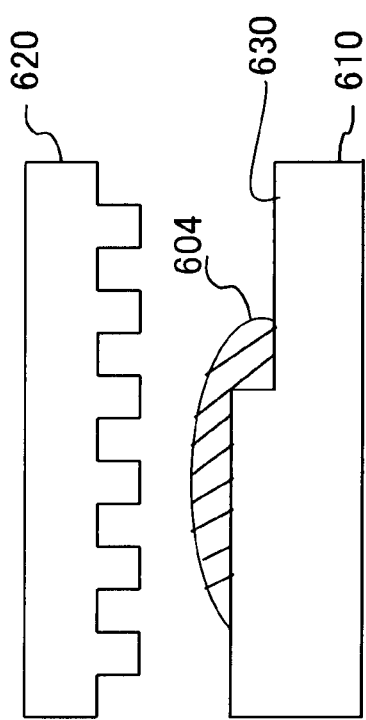
FIGS. 6A-6D are views to explain a method of coating resist according to the embodiment.

As shown in FIG. 6A, a resist 604 is not fully supplied onto a concave portion 630 of a substrate (wafer) 610 to be processed and to face a template 620 when the resist 604 is coated without considering the surface shape of the substrate 610, in the case that the concave portion 630 is produced on a part of the substrate 610.

Figure 6B:
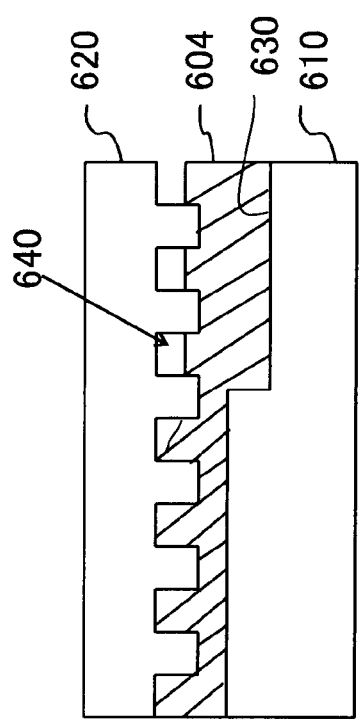

Namely, as shown in FIG. 6B, the resist amount filled in concave patterns of the template 620 is insufficient, and defects 640 due to filling failure defect occurs, because the distance to the surface of the template 620 is large at the concave portion 630 when the template 620 is brought into contact with the resist 604 on the substrate 610.

Figure 6C:
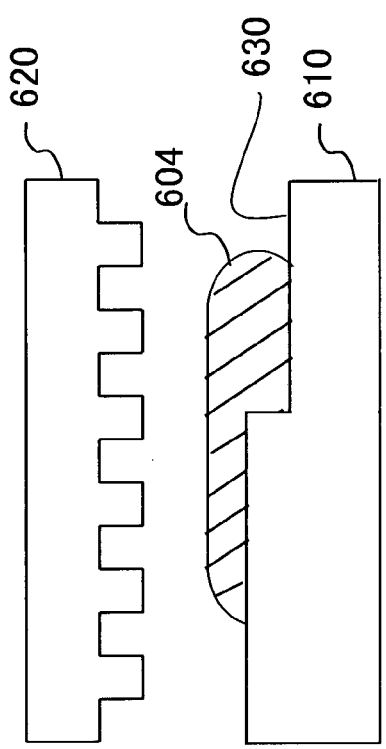
Figure 6D:
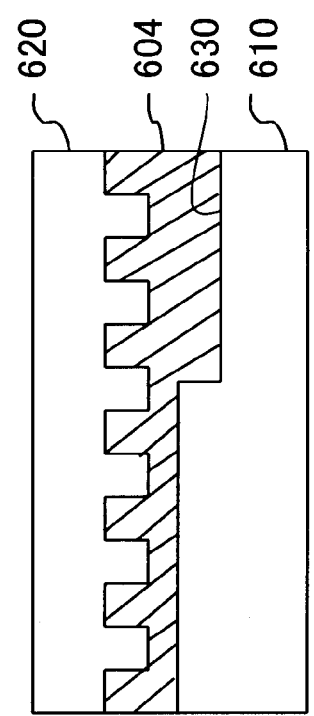

However, as shown in FIG. 6C, if the resist coating distribution is modified so as to increase the amount of resist to be coated onto the concave portion 630 of the substrate 610, as shown in FIG. 6D, defects due to filling failure are prevented from occurring on imprinting, and therefore, accurate imprint processing can be performed. On the other hand, when a convex portion is produced on the substrate 610, it is sufficient only to modify the resist coating distribution so that the amount of resist supplied to the convex portion is reduced.

A concavo-convex shape of a substrate can be measured using a AFM or the like before coating a resist for imprinting on the substrate. Alternatively, the concavo-convex shape of the substrate may be calculated by performing various fabrication process simulations. The substrate surface shape may be calculated based on experimental data, by obtaining influences of various fabrication processes on the substrate surface shape as the experimental data, previously.

According to the embodiment, the resist coating distribution is calculated in consideration of the pattern variation amount between the template pattern data and the pattern actually formed on the template, and moreover, in consideration of the film-thickness of the remaining resist, the distribution of resist volatilization volume, and the concavo-convex shape of the substrate surface, additionally. Thus, filling failure of a resist can be reduced, and pattern failure can be suppressed by determining the resist coating distribution appropriately to be employed in an imprint method, as described above.

A method of forming a pattern using an imprinting method according to the embodiment will be described with reference to FIGS. 7A to 7D. FIGS. 7A to 7D are cross-sectional views to explain the method of forming the pattern.

Figure 7A:
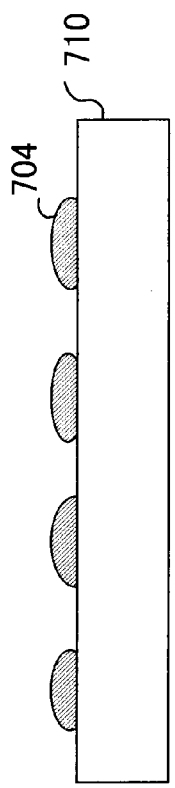
FIGS. 7A-7D are sectional views to explain an imprint method as the method of forming the pattern according to the embodiment.

As shown in FIG. 7A, a resist (resist droplets) 704 for imprinting is coated onto a substrate (for example, a wafer) 710. A film to be processed or a hard mask may be formed on the substrate 710 below the resist 704. The resist 704 is coated based on a resist coating distribution calculated in step S4 of FIG. 4. Specifically, the resist 704 is coated based on a resist coating distribution in consideration with information of a pattern actually formed on a template, further, film-thickness of a remaining resist, distribution of resist volatilization volume, and concavo-convex shape of the substrate surface.

Figure 7B:
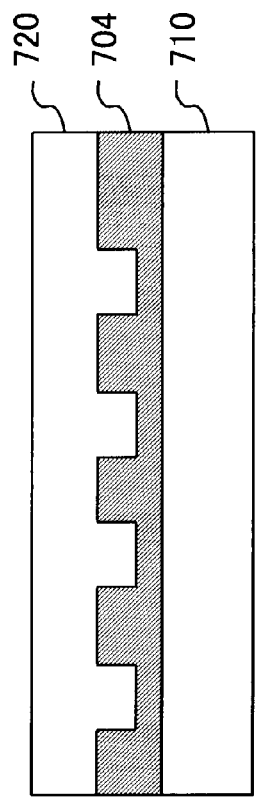

Then, as shown in FIG. 7B, a prepared template 720 is brought into contact with the resist 704 on the substrate 710, and the resist 704 is filled in a concave pattern of the template 720. The template 720 is the master template shown in FIG. 3C or the copy template shown in FIG. 3F. Since the coating distribution of the resist 704 is determined based on the information of the pattern actually formed on the template 702, and, further, based on the distribution of volatilization volume of the resist 704 and the concavo-convex shape of the surface of the substrate 710, filling defects of the resist 704 can be suppressed to occur.

Figure 7C:
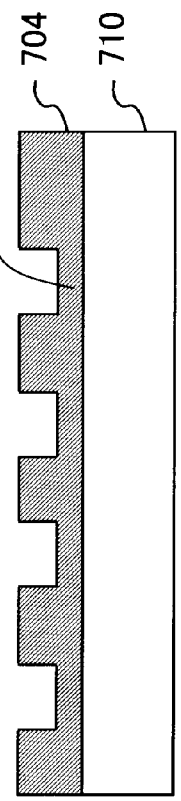

Subsequently, as shown in FIG. 7C, the resist 704 is cured by light irradiation, for example, and, then, the template 720 is separated from the resist 704.

Figure 7D:
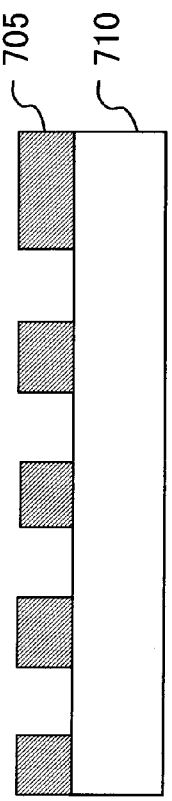

Further, a thin remaining resist film 704a formed at the bottom portions of concave portions of the resist on the substrate 710 is subjected to etching back and is removed. Consequently, as shown in FIG. 7D, a resist pattern 705 is formed on the substrate 710.

Then, though not illustrated, the substrate 710 is processed to be etched by using the resist pattern 705 as a mask so that a concave pattern is formed on the substrate 710. The concave pattern to be formed on the substrate 710 is a gate pattern of a semiconductor integrated circuit, for example.

In the embodiment, the resist coating distribution is calculated in consideration of the pattern variation amount between the template pattern data and the pattern actually formed on the template. Thus, by setting the resist coating distribution appropriately, filling failure of resist on imprinting is reduced, and pattern failure can be suppressed.

A defect inspection of the substrate 710 with the pattern formed by the imprint method described in FIGS. 7A to 7D can be carried out, and the positional coordinates and the defect sizes of defects due to the filling failure detected by the defect inspection can be obtained. The positional coordinates and the defect sizes can be fed back to the coating distribution of the resist 704.

Specifically, a resist coating amount insufficient locally can be modified again based on the positional coordinates and the defect sizes of the defects due to filling failure. For example, a more appropriate resist coating distribution can be obtained by increasing the coating amount of resist of the portions corresponding to the positional coordinates of the defects due to filling failure. In the pattern forming using the imprint method shown in FIGS. 7A to 7D, the pattern accuracy can be further improved by coating the resist 704 on the substrate 710 based on the resist coating distribution modified again.

In the method of calculating the resist coating distribution shown in FIG. 4, the template pattern data is modified based on the pattern variation amount obtained by comparing the template pattern information and the template pattern data. The resist coating distribution is calculated based on the modified template pattern data.

However, the resist coating distribution does not always need to be calculated after the template data is modified once. The resist coating distribution may be calculated directly from the template pattern information of a template on which a pattern is formed. In this case, a two-dimensional SEM image of the template pattern and a three-dimensional profile representing a pattern depth of the template pattern may be obtained as template pattern information, and, from the obtained template pattern information, an appropriate resist coating distribution may be calculated.

The method of calculating the resist coating distribution according to the embodiment can be applied on calculating resist coating distribution for various cases in fabrication of a semiconductor device. For example, the method can be applied for the case that a circuit pattern, a resist pattern, or a hard mask pattern is formed on a wafer substrate. The method can be applied also for the case that a mask pattern or a template pattern is formed on a substrate in fabrication of a photomask or a template to be used in an imprint method. The method can be applied also for the case that a pattern is formed on a substrate in fabrication of a hard disk. Further, the method can be applied for the case that a pattern is formed on a substrate in fabrication of a photo array.

While certain embodiments have been described, the embodiments have been presented by way of example only, and are not intended to limit the scope of the inventions. Indeed, the novel methods, systems and programs described herein may be embodied in a variety of other forms; furthermore, various omissions, substitutions and changes in the form of the methods, systems and programs described herein may be made without departing from the spirit of the inventions. The accompanying claims and their equivalents are intended to cover such forms or modifications as would fall within the scope and spirit of the inventions.

What is claimed is:

1. An imprint method of forming a pattern, comprising:
    obtaining information of a template pattern which is actually formed on a template for use in imprinting and measured by a measurement device, the template being made based on design pattern data, the information of the template pattern including at least one of density, dimension, position, sidewall tilt angle or depth of the template pattern;
    obtaining information related to a difference between the information of the measured template pattern and information of a design pattern of the design pattern data;
    modifying the design pattern data based on the information related to the difference;
    setting a resist coating distribution based on the information of the modified design pattern data;
    coating a resist on a substrate based on the resist coating distribution;
    contacting the template onto the resist coated on the substrate and filling the resist into the template pattern;
    curing the resist filled in the template pattern; and
    separating the template from the cured resist.

2. The method according to claim 1, wherein the substrate is a wafer.

3. The method according to claim 1, wherein the template pattern data is master template pattern data, the template is a master template, the information of the template pattern is information of the master template pattern, and the substrate is a copy template.

4. The method according to claim 1, wherein the resist is coated on the substrate of which surface is provided with a hard mask.

5. The method according to claim 1, wherein the resist coating distribution is set further based on film-thickness of a remaining resist at a concave portion of the resist, after separating the template from the resist.

6. The method according to claim 1, wherein the resist coating distribution is set further based on distribution of resist volatilization volume.

7. The method according to claim 1, wherein the resist coating distribution is set further based on concavo-convex shape of a surface of the substrate.

8. An imprint method of forming a pattern, comprising:
    obtaining information of a template pattern which is actually formed on a template for use in imprinting and measured by a measurement device, the template being based on design pattern data, the information of the template pattern including at least one of density, dimension, position, sidewall tilt angle or depth of the template pattern;
    comparing the information of the measured template pattern and information of a design pattern of the design pattern data;
    modifying the design pattern data based on a result of the comparison;
    setting a resist coating distribution based on the information of the modified design pattern data;
    coating a resist on a substrate based on the resist coating distribution;
    contacting the template onto the resist coated on the substrate;
    curing the resist; and
    separating the template from the cured resist.

9. The method according to claim 8, wherein setting the resist coating distribution includes:
    comparing the template pattern data with the information of the template pattern and obtaining a pattern variation amount; and
    modifying the template pattern data based on the pattern variation amount, the resist coating distribution being set based on the modified template pattern data.

10. The method according to claim 8, wherein the substrate is a wafer.

11. The method according to claim 8, wherein the template pattern data is master template pattern data, the template is a master template, the information of the template pattern is information of the master template pattern, and the substrate is a copy template.

12. The method according to claim 8, wherein the resist is coated on the substrate of which surface is provided with a hard mask.

13. The method according to claim 8, wherein the resist coating distribution is set further based on film-thickness of a remaining resist at a concave portion of the resist, after separating the template from the resist.

14. The method according to claim 8, wherein the resist coating distribution is set further based on distribution of resist volatilization volume.

15. The method according to claim 8, wherein the resist coating distribution is set further based on concavo-convex shape of a surface of the substrate.

16. An imprint method of forming a pattern, comprising:
    obtaining information of a template pattern which is actually formed on a template for use in imprinting and measured by a measurement device, the template being based on design pattern data, the information of the template pattern including at least one of density, dimension, position, sidewall tilt angle or depth of the template pattern;
    modifying the design pattern data based on the information of the measured template pattern;
    setting a resist coating distribution based on the information of the modified design pattern data;
    coating a resist on a substrate based on the resist coating distribution;
    contacting the template onto the resist coated on the substrate;
    curing the resist; and
    separating the template from the cured resist.

17. The method according to claim 16, wherein setting the resist coating distribution includes:

comparing the template pattern data with the information of the template pattern and obtaining a pattern variation amount; and modifying the template pattern data based on the pattern variation amount, the resist coating distribution being set based on the modified template pattern data.

18. The method according to claim 16, wherein the substrate is a wafer.

19. The method according to claim 16, wherein the template pattern data is master template pattern data, the template is a master template, the information of the template pattern is information of the master template pattern, and the substrate is a copy template.

20. The method according to claim 16, wherein the resist is coated on the substrate of which surface is provided with a hard mask.

21. The method according to claim 16, wherein the resist coating distribution is set further based on film-thickness of a remaining resist at a concave portion of the resist, after separating the template from the resist.

22. The method according to claim 16, wherein the resist coating distribution is set further based on distribution of resist volatilization volume.

23. The method according to claim 16, wherein the resist coating distribution is set further based on concavo-convex shape of a surface of the substrate.

* * * * *